United States Patent
Chen (10) Patent No.: US 7,700,444 B2
(45) Date of Patent: Apr. 20, 2010

(54) POST-LITHOGRAPHY MISALIGNMENT CORRECTION WITH SHADOW EFFECT FOR MULTIPLE PATTERNING

(75) Inventor: Yijian Chen, 1049 Talbot Ave., Albany, CA (US) 94706

(73) Assignee: Yijian Chen, Santa Clara, CA (US)

( * ) Notice: Subject to any disclaimer, the term of this patent is extended or adjusted under 35 U.S.C. 154(b) by 636 days.

(21) Appl. No.: 11/586,274

(22) Filed: Oct. 26, 2006

(65) Prior Publication Data
US 2008/0102647 A1    May 1, 2008

(51) Int. Cl.
*H01L 21/336* (2006.01)
*H01L 21/302* (2006.01)
*H01L 21/461* (2006.01)

(52) U.S. Cl. .......... 438/279; 438/712; 438/713
(58) Field of Classification Search ........... 438/279, 438/712, 713; 257/E21.218
See application file for complete search history.

(56) References Cited

U.S. PATENT DOCUMENTS

2002/0164885 A1 * 11/2002 Lill et al. .......... 438/739

* cited by examiner

*Primary Examiner*—William M. Brewster (57) ABSTRACT

Misalignment created during a multiple-patterning process is a serious challenge for critical dimension (CD) control and layout design in continuing integrated-circuit device scaling. A number of post-lithography misalignment correction technologies based on the shadow effect are invented for multi-patterning lithographic applications. When applied to transfer patterns from a top layer to an underneath layer, the subtractive shadow effect in anisotropic plasma etching combined with a hard-mask process, will shift the position of features such that the previously produced misalignment can be corrected. Also, additive shadow effect in a sputtering/evaporation process can be used. Misalignment correction methods allow the semiconductor industry to print sub-32 nm (half-pitch) features using the double-patterning technique with currently existing lithographic tools (e.g., 193-nm DUV scanner), therefore postponing the need of expensive next-generation lithography (NGL). The misalignment correction methods can be applied to existing lithography technologies to print features smaller than their physical resolution limits.

4 Claims, 8 Drawing Sheets

POST-LITHOGRAPHY MISALIGNMENT CORRECTION WITH SHADOW EFFECT FOR MULTIPLE PATTERNING

BACKGROUND OF THE INVENTION

Optical DUV (deep ultraviolet, 193 nm) immersion lithography with NA≈1.3 has the capability of printing half-pitch features down to about 40 nm. The potential next-generation lithography (NGL) technologies include EUV (extreme ultraviolet), maskless, and nano-imprint lithography [1]. However, all these NGL technologies face their own technological challenges and still need a long development time before their applications in high-throughput manufacturing. Recently, double patterning has attracted much industrial interest which prints less dense line/space or contact hole patterns twice on the same wafer to finally obtain dense patterns with double spatial frequency [2]. In principle, a similar multiple-patterning concept can be developed but both need extremely high alignment accuracy. It is a severe challenge to significantly reduce the misalignment budget in a lithographic process to meet the multiple-patterning requirement at 32 nm half pitch and below. Therefore, post-lithography misalignment correction will be a promising alternative technology enabling multiple patterning (including double patterning) for future semiconductor manufacturing. It provides a production-worthy method for the whole semiconductor industry to continue device scaling beyond sub-40 nm generation with no need of NGL technology.

Several post-lithography misalignment correction techniques based on the shadow effect in anisotropic plasma etch or sputtering/evaporation processes are invented which allow us to significantly reduce the misalignment created in a lithographic process. Next, we demonstrate the forming mechanism of misaligned dense line/space patterns during a double-patterning process. Similar misalignment mechanism exists in the multiple-patterning process.

Figure 1:
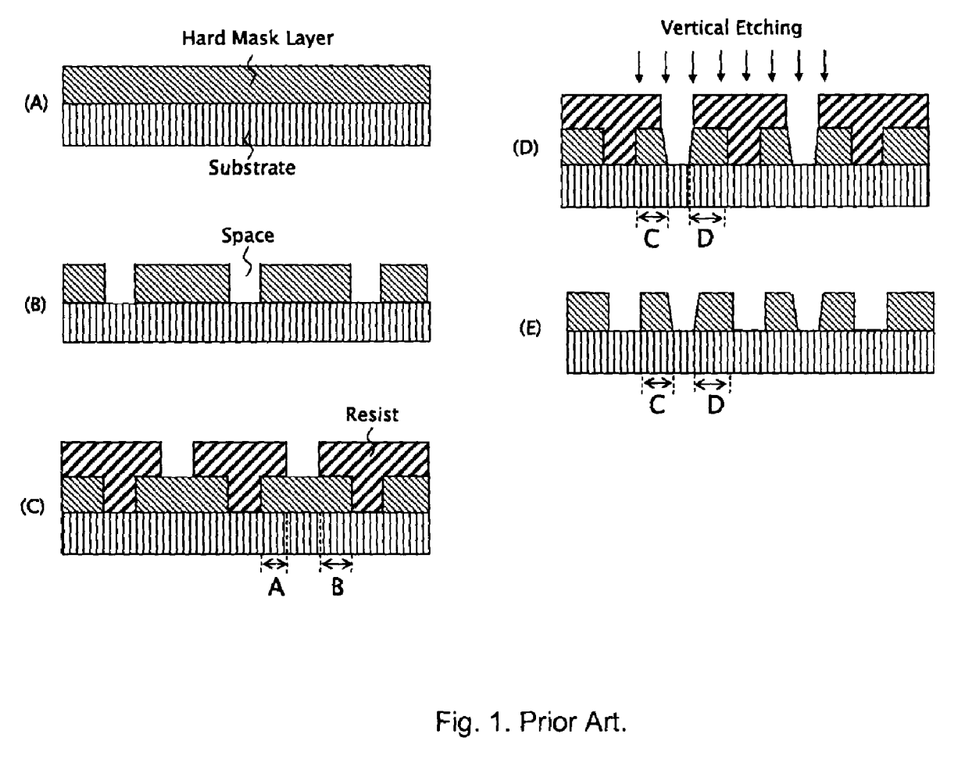
FIG. 1, a figure of representing prior art, depicts a process example to demonstrate how misalignment is produced in a double-patterning process.

In FIG. 1, the cross-section view of a double-patterning process flow to print misaligned dense line/space and contact hole patterns is shown. Starting with a targeted layer on top of the substrate, semi-dense features are printed on the targeted layer using standard lithographic and dry etching processes (shown in FIG. 1(B)), with their pitch size twice the size of desired pitch as shown in FIG. 1 (E). After that, another resist film is spun on the top and the wafer is exposed again with the same pattern shifted by a distance such that ideally every trench center in the resist will be coincident with the center of corresponding line structure underneath. However, as shown in FIG. 1(C), the trench is not located right at the center of the line (e.g., A≠B) due to an unavoidable misalignment during a lithographic process. Consequently, this misalignment will be transferred to the targeted layer underneath in the following plasma etching process assuming its etching direction is vertical as shown in FIG. 1(D). This results in unequal width of the final dense features (e.g., length C≠D) and brings serious challenges to process yield and circuit design/layout. Similar problem exists in a multiple-patterning process to obtain dense features with their pitch reduced to ⅓, ¼, . . . , of the original size corresponding to the resolution limit of a conventional lithographic tool.

Figure 2:
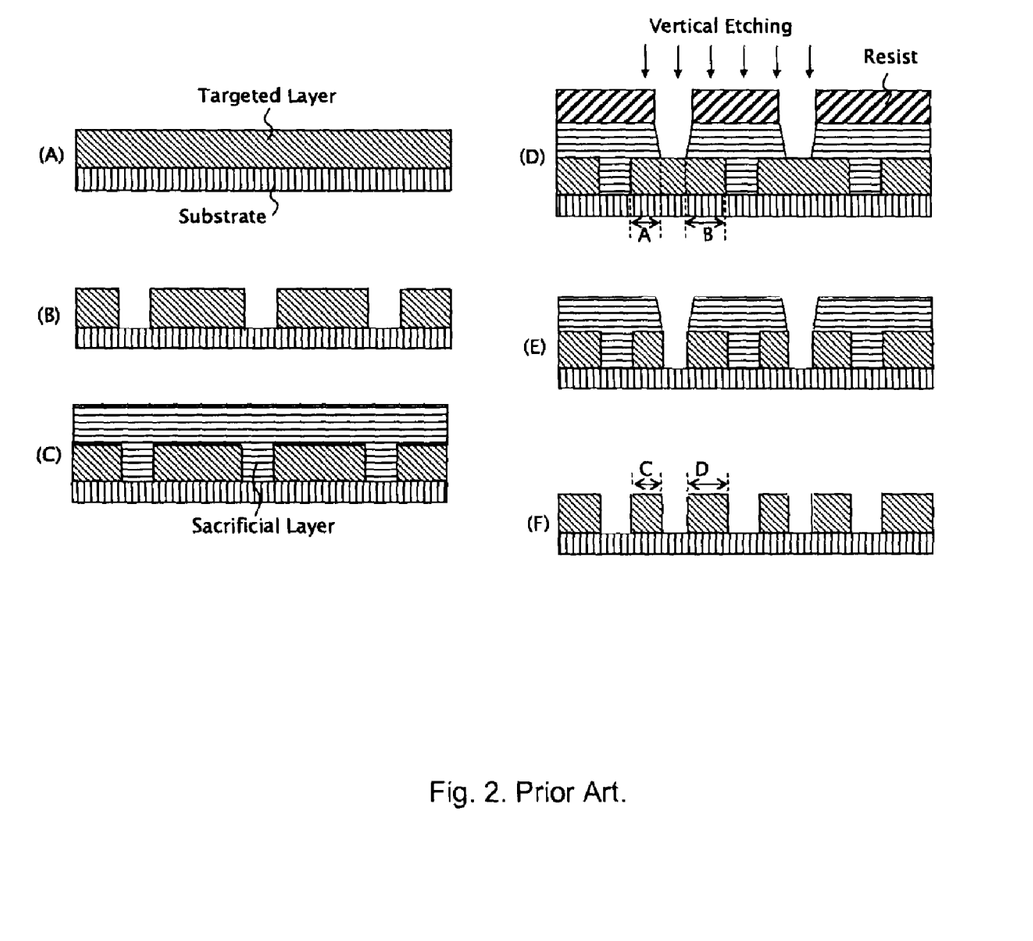
FIG. 2, a figure of representing prior art, depicts another process example (wherein a sacrificial layer is used) to demonstrate how misalignment is produced in a double-patterning process.

The process flow shown in FIG. 2 is similar to previously described process except that a sacrificial layer is deposited before the second lithographic step. This sacrificial layer finally will be released and can be polished to flatten the surface (e.g., with a CMP process) resulting in an improved lithographic process window. However, if the plasma etching direction is vertical, the misalignment is still transferred to the targeted layer as shown in FIG. 2(F) (e.g., C≠D).

Figure 3:
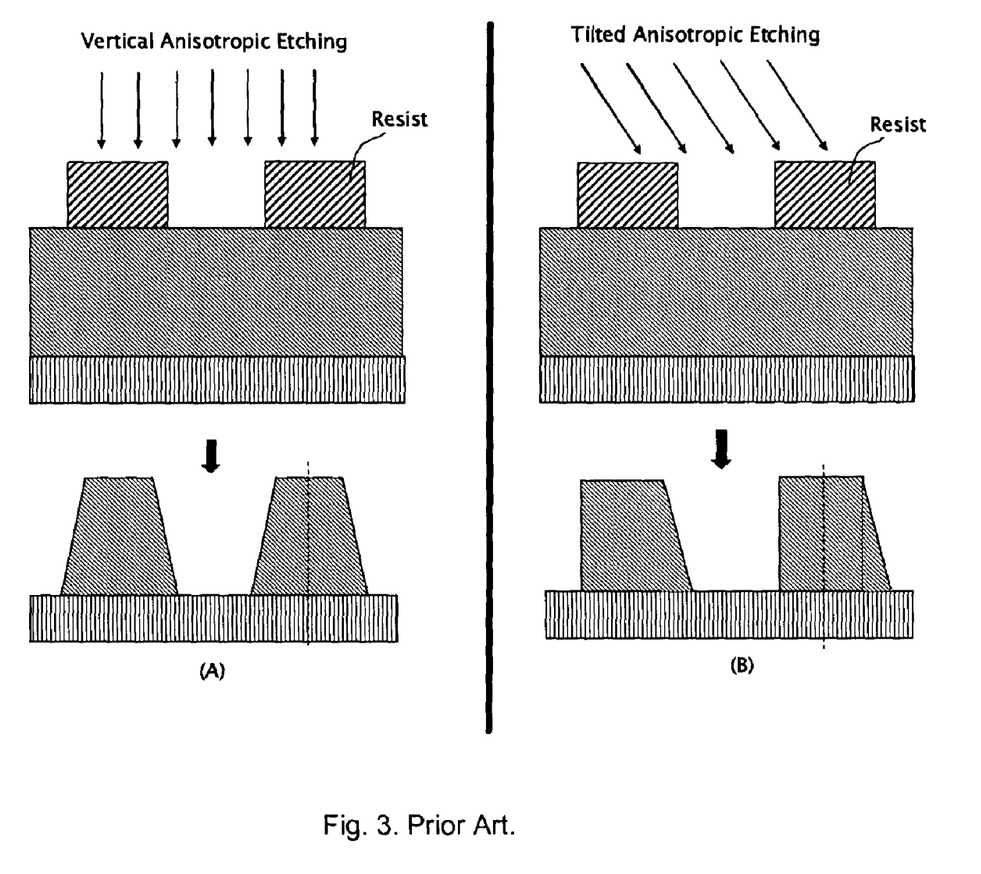
FIG. 3, a figure of representing prior art, depicts the shadow effect (not to scale) in an anisotropic plasma etching process.

As demonstrated before, if the ions' incident direction is vertical to the substrate surface, the misalignment will be transferred to the targeted layer. Next, we shall describe a so-called shadow effect which occurs in both subtractive anisotropic plasma etching and additive sputtering/evaporation processes, and can be used to correct the misalignment created during a lithographic process. As shown in FIG. 3, we compare two plasma etching processes in which one etching is in vertical direction as shown in FIG. 3(A), and the other etching is tilted by certain angle as shown in FIG. 3(B). The tilted etching can be achieved by either directly tilting the ions' bombarding direction or tilting the wafer surface. Both dash lines drawn in the figure represent the central position of the right-side structure formed in a vertical etching process. When the etching direction is tilted as shown in FIG. 3(B), two effects occur. First, the slope of left side walls of the etched structures becomes more vertical while the opposite happens to the slope of right side walls, which results in asymmetric final structures. Secondly, relative to the dashed line which indicates the center of a final structure produced in the vertical etching, the mass center of the asymmetric structure formed in a tilted etching process moves toward the right side. The shift distance depends on the etching direction as well as the etching selectivity. Even though the etched structures are asymmetric, this asymmetry will not be transferred to the substrate if we can use those structures as a hard mask with high selectivity when etching the underneath substrate.

Figure 4:
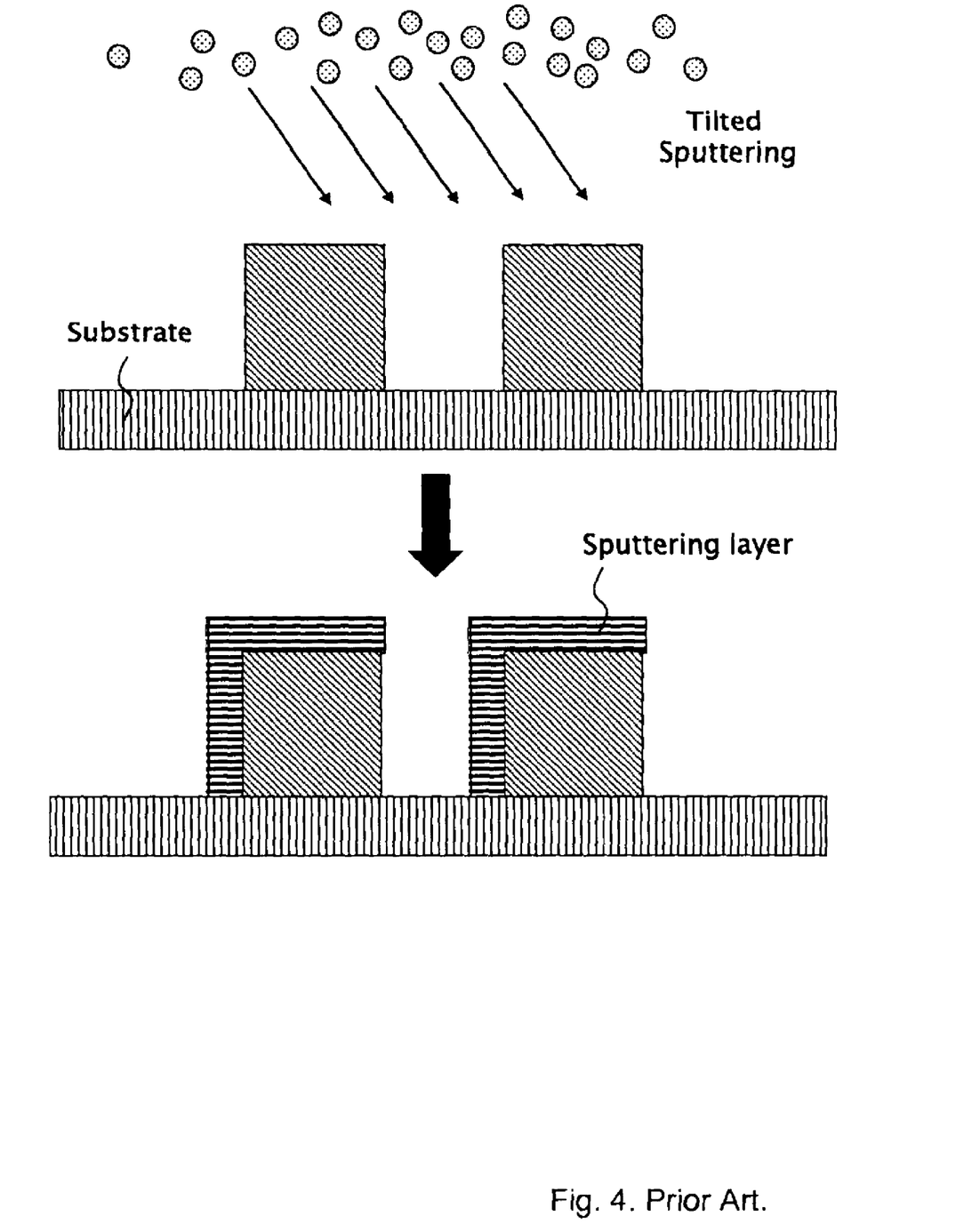
FIG. 4, a figure of representing prior art, depicts the shadow effect (not to scale) in a sputtering/evaporation process.

The shadow effect also occurs in an additive process such as sputtering or evaporation deposition as shown in FIG. 4. First, a dense structure is patterned and etched into the substrate. When the sputtering direction is tilted toward the right side, the step coverage is not conformal as deposition occurs only on the top and left side walls. This effect can also be used to correct misalignment.

The misalignment correction process can vary, depending on whether a sacrificial layer is used between two exposures (e.g., in a double-patterning process) and when the misalignment can be measured. We shall demonstrate the correction processes based on the shadow effect of anisotropic plasma etching without a sacrificial layer first.

REFERENCES

[1] International Technology Roadmap for Semiconductors (ITRS), 2005 version.
[2] Yan Borodovsky, "Marching to the Beat of Moore's Law", plenary talk in SPIE Microlithography, San Jose, Calif., 2006.

DETAILED DESCRIPTION OF THE INVENTION

Figure 5:
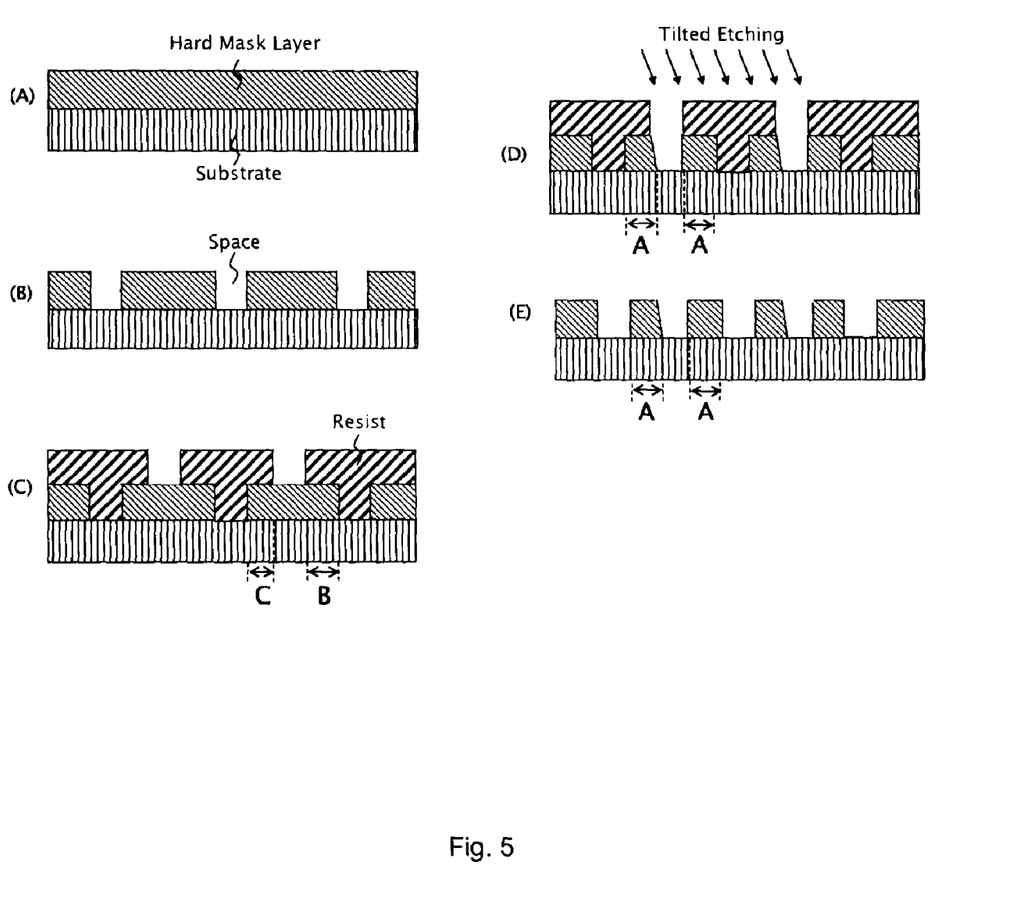
FIG. 5, a figure of representing an embodiment of the invention, depicts an anisotropic etching-based process (without a sacrificial layer) to correct the misalignment created during the lithographic step and measured right after that lithographic step.

If the misalignment can be measured right after the exposed resist is developed and baked, then the correction process is shown in FIG. 5. The tilting angle can be arbitrary (2-D) and should be adjusted according to measured values of misalignment in both X and Y directions; but here we only use the right-tilted etching as an example to demonstrate the concept. First, we put a hard mask on top of the substrate and pattern this hard-mask layer with semi-dense features wherein the size of lines is three times of the size of spaces as shown in FIG. 5(A) and FIG. 5(B). In step 5(C), resist is spun on the patterned hard-mask layer and exposed again to print another pattern of semi-dense features with its position shifted. Ideally, we would like to shift the second pattern in such a way that the trenches in the resist will be located right at the center of the corresponding line structures underneath. However, due to misalignment in a lithographic process, perfect overlay can not be achieved and as a result unequal distances (e.g., C<B) are created as shown in FIG. 5(C). To correct the resultant misalignment in this condition, the etching direction will be tilted toward the right side as shown in step 5(D). Owing to the shadow effect as demonstrated before, the tilted etching can produce a dense structure with uniform bottom CD (critical dimension, e.g., equal to size A as shown in FIG. 5(D)) everywhere. Even the slope of final dense line/space structure is not uniform, due to the high selectivity of hard mask to the substrate in a following plasma etching, this non-uniformity will not be transferred to the substrate or only little effect will be seen after the anisotropic dry etching.

Figure 6:
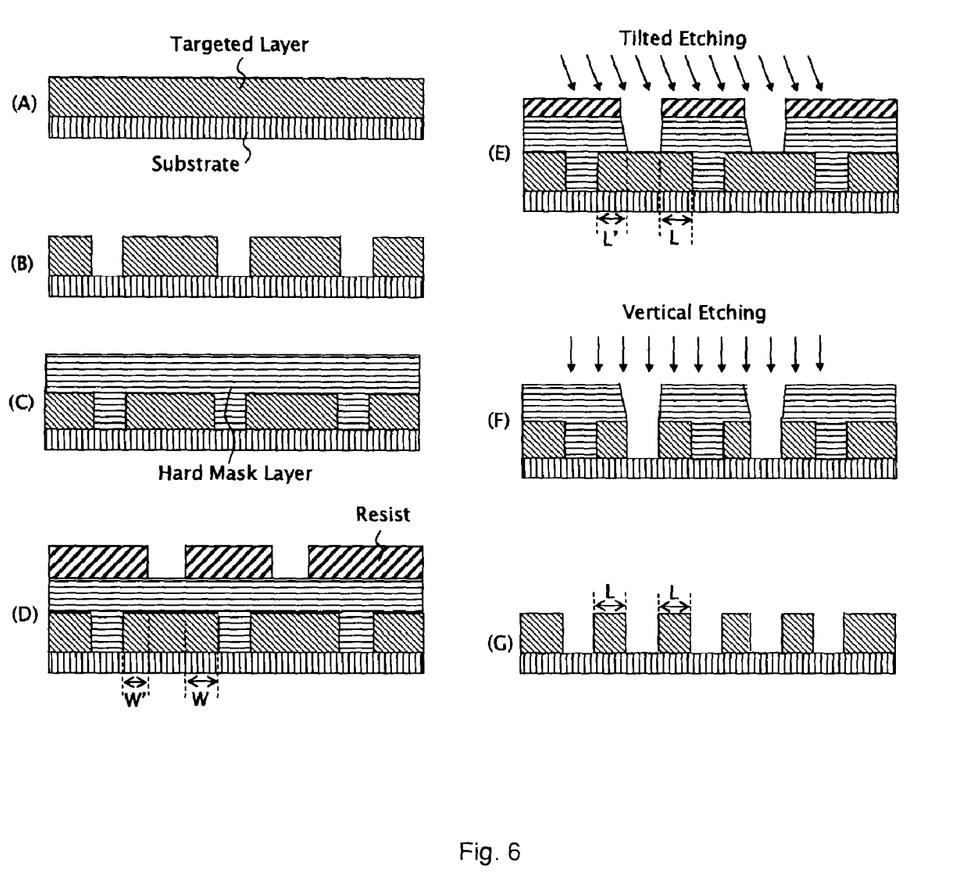
FIG. 6, a figure of representing a second embodiment of the invention, depicts an anisotropic etching-based process (with a hard mask layer) to correct the misalignment created during the lithographic step and measured right after that lithographic step.

Another possibility exists if a sacrificial (to be used as a hard-mask later) layer is deposited between two lithographic exposures as shown in FIG. 6(C). In this case, misalignment can be corrected with a similar tilted etching when the pattern on the resist is transferred to the hard-mask layer. First, the targeted layer is patterned with semi-dense features wherein the size of lines is three times of the size of spaces. Then a hard-mask layer is deposited and an optional CMP step may be used to planarize the surface, as shown in FIG. 6(C). After this, a resist is spun on the top and the second lithographic step will print another pattern of semi-dense features which are the same as the previous pattern and ideally should be shifted by a distance equal to the space size. Due to the misalignment in the second exposure, the shift distance will not be exactly equal to the desired value. As a result, the distance W' indicated in FIG. 6(D) is not equal to W. Apparently, W-W' (assuming W>W') is the misalignment which can be measured right after the lithographic step. After the misalignment data is available, the tilted etching will be applied to correct this error during the following dry etching process. The goal is to create equal line/space pattern (e.g., size L as shown in step 6(G)) with double spatial frequency. Ideally, if the hardmask structure such as slope and CD does not change during the following etching, then the bottom CDs as indicated in FIG. 6(E) should be equal (i.e., L'=L) such that the transferred line/space structures in the targeted layer have the uniform size L everywhere. Practically, however, the shape of hardmask structures may slightly change after dry etching; therefore, size L' will be close, but not exactly equal to L. Similar conclusion about this small difference is applicable to all the cases discussed in this patent, but not mentioned repeatedly elsewhere.

Figure 7:
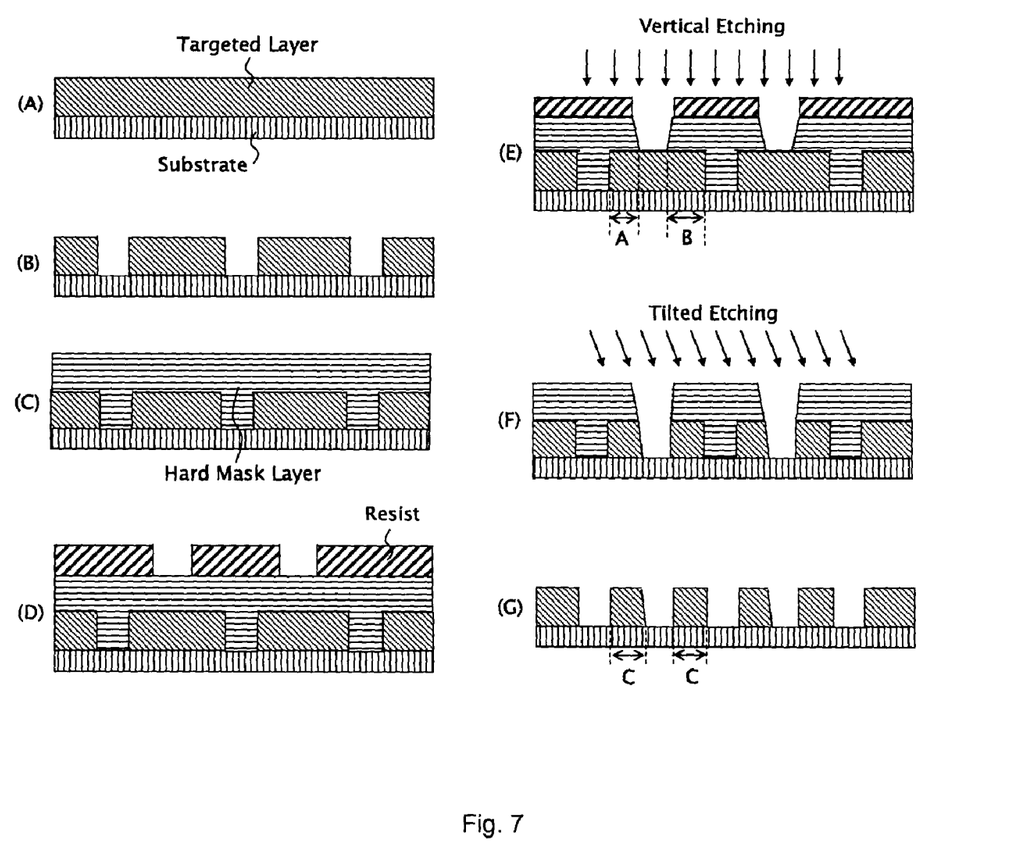
FIG. 7, a figure of representing a third embodiment of the invention, depicts an anisotropic etching-based process to correct the misalignment created during the lithographic step and measured right after the etching step.

On the other hand, if misalignment can not be measured right after the lithographic step, then we will not be able to apply the shadow effect to correct the misalignment during the first following etching. In this condition, the first anisotropic etching direction will still be vertical as shown in FIG. 7(D) due to the lack of real-time data for correction. After this plasma etching, the misalignment in the resist pattern will be transferred to the hard mask layer underneath (e.g., A≠B). If misalignment can be measured only after the first etching (with patterned resist on the top) is finished, then this hard mask layer is necessary as we shall apply the tilted etching to correct the misalignment during the second etching which will transfer the pattern from the hard mask to the targeted layer as shown in step 7(F).

Figure 8:
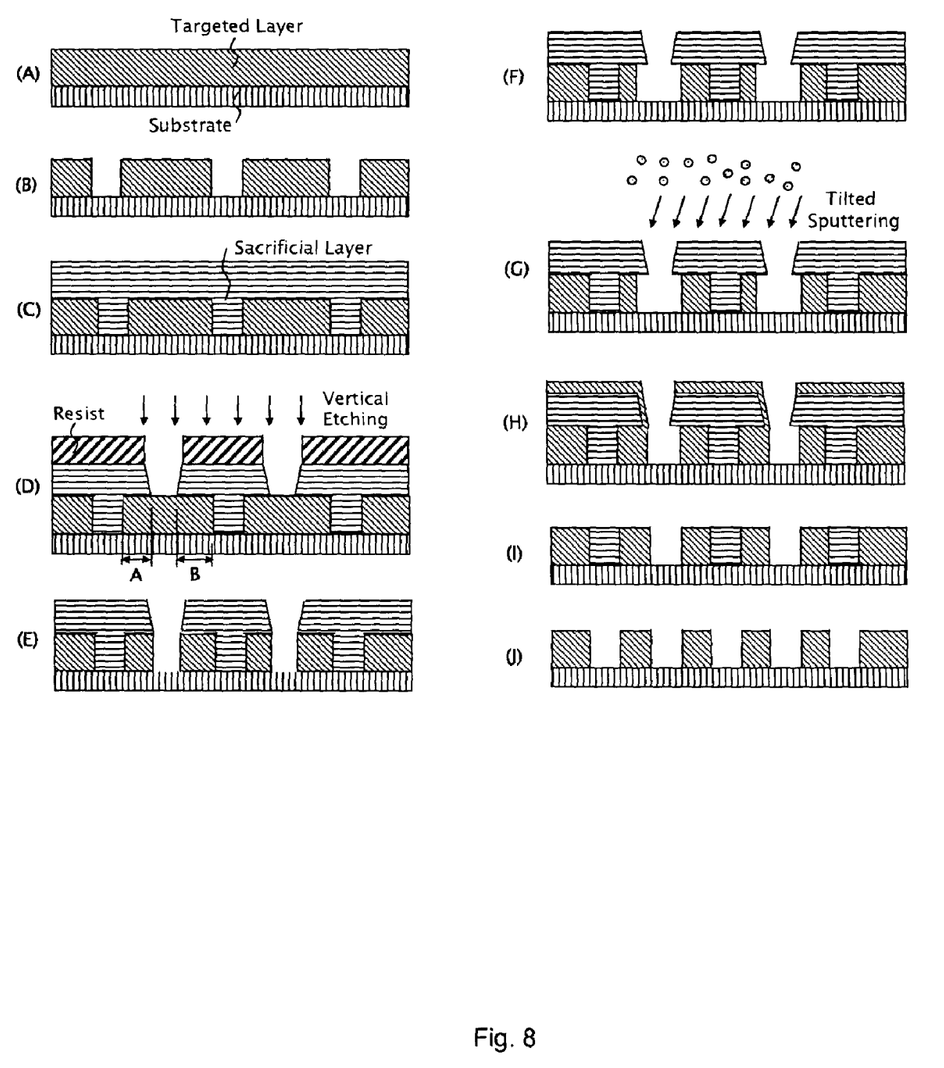
FIG. 8, a figure of representing a fourth embodiment of the invention, depicts a sputtering-based process to correct the misalignment created during the lithographic step.

All we discussed before is to use the subtractive shadow effect of a tilted anisotropic etching to correct the misalignment created during the lithographic processes. Another possibility is to apply the additive shadow effect of a sputtering/evaporation as demonstrated before to correct the misalignment. As shown in FIGS. 8(A) and 8(B), the targeted layer is deposited on top of the substrate and patterned with semi-dense features first. A sacrificial material is then deposited to fill the trenches and may be polished (with a CMP process) to planarize the surface. A resist thin film is spun on the top and another pattern of semi-dense features is printed on the resist, however, with a misalignment such that unequal distances are created in the following vertical dry etching (e.g., A≠B as shown in FIG. 8(D)). After this, the misaligned pattern is etched into the targeted layer as shown in FIG. 8(E). A following isotropic etching (either wet or dry) will be used to produce the undercut structures as shown in FIG. 8(F) assuming the shape of the top sacrificial layer is not changed. However, this assumption is not essential and a slight change of the shape of top sacrificial layer due to the isotropic etching can be allowed. This undercut forming step is important in that it will remove the undesired effect of shrinking the trench in the following sputtering/evaporation process. The misalignment correction is then achieved by tilting the sputtering angle (toward the left side in this example) such that only the top and the left side wall are covered by the sputtering material. In reality, the tilting angle can be arbitrary (2-D) depending on the misalignment in both X and Y directions. In this way, the unequal width of line structures as seen in FIG. 8(G) can be compensated such that uniform line CD as shown in FIG. 8(H) can be obtained. In step 8(I), a CMP process is applied to remove the top layers and expose the sacrificial layer which will be etched away in step 8(J). The final line/space structures after sacrificial release with double spatial frequency is shown in FIG. 8(J).

In all above discussions, we assume that misalignment is uniform for every field on the wafer. However, practically each field might have different misalignment (in both X and Y); therefore, it is valuable to develop local correction technology which allows us to correct varying misalignment on different fields in the same etching process. There are two possible ways to achieve this. The first way is to divide the bottom (or top/both) electrode of etching chamber to a number of smaller areas and each of them is electrically isolated from each other such that different voltages can be applied to different areas. In this way, we are able to control the voltages applied to different areas on the same wafer and adjust the ions' speed for different areas during the same plasma etching. Since the correction is affected by the local ion speed, non-uniformity of misalignment can be significantly reduced. The second way is to locally adjust the etching angle, which needs the capability to locally adjust the angles of emitting surface of electrodes. For this purpose, electrodes can be designed to consist of a number of smaller pieces of metals and each of them can be moved (up and down) and rotated independently.

For sputtering/evaporation-based local correction of non-uniform misalignment, the local control of incident speed and angle of sputtering atoms can be achieved by inserting a speed/angle filter (which can determine the local incident speed and angle of atoms) between sputtering source and wafer/substrate.

As used in this patent, "substrate" may be a support material with or without layers formed thereon. The support material may be a conductor or an insulator or a semiconductor, for example, a semiconductor substrate used in integrated circuits.

The invention claimed is:

1. A tilted anisotropic plasma etching process comprising:
   a. A hard-mask layer with high etching selectivity to a substrate is put on top of the substrate, and first semi-dense features are printed with a standard lithographic process and etched into the hard-mask layer wherein the size of lines is three times of the size of spaces wherein the spaces have a first centerline;
   b. a resist is spun on the hard-mask layer and exposed again to print a second pattern of semi-dense features with its position shifted by a distance approximately equal to the space size such that the second features have a centerline that have a misalignment with the centerline of the first spaces underneath;
   c. the misalignment is measured right after the second lithographic step, based on which calculations of the needed tilting direction and etching angle to correct the misalignment;
   d. the calculations are used to determine the required shadow effect in an anisotropic plasma etching will be applied to correct the resultant misalignment wherein the etching direction is tilted and the due to the shadow effect, the tilted etching can produce dense structures in the first features with equal or nearly equal bottom width in the first semi-dense features.

2. The tilted anisotropic plasma etching process of claim 1 further comprising:
   b-1. after step a. above, a second hard-mask layer is then deposited and an optional CMP step may be used to planarize the surface;
   b-2. a resist is spun on the top of the second hard-mask and the second lithographic step will print a second pattern of semi-dense features which is the same as the previous pattern with its position shifted by a distance approximately equal to the space size such that the second features have a centerline that have a misalignment with the centerline of the first spaces underneath;
   c. the misalignment is measured right after the second lithographic step, based on which calculations of the needed tilting direction and etching angle to correct the misalignment;
   d. the calculations are used to determine the required shadow effect in an anisotropic plasma etching will be applied to correct the resultant misalignment wherein the etching direction is tilted and the due to the shadow effect, the tilted etching can produce dense structures in the first features with equal or nearly equal bottom width in the first semi-dense features.

3. The tilted anisotropic plasma etching process of claim 2 further comprising:
   a-1. after step a. a misalignment reading is taken after the first lithographic step, based on which calculations of the needed tilting direction and etching angle to correct the misalignment;
   d-1. the calculations of the first lithographic step are taken and are used to determine the required shadow effect in an anisotropic plasma etching will be applied to correct the resultant misalignment wherein the etching direction is tilted and the due to the shadow effect, the tilted etching can produce dense structures in the first features with equal or nearly equal bottom width in the first semi-dense features.

4. The tilted anisotropic plasma etching process of claim 2 further comprising:
   e. after step c. an isotropic etching (either wet or dry will be used to produce spaces in said first semi-dense features with the spaces undercutting the second hard-mask structures;
   f. the misalignment is corrected by tilting the sputtering angle such that only the top and the left side wall are covered by the sputtering material and the unequal width of line structures can be compensated to get uniform line critical dimension;
   g. a following CMP process removes the top layers and exposes the second hard-mask layer;
   h. the second hard-mask layer is etched away to form the final line/space structures
with double spatial frequency.

* * * * *